United States Patent
Majumdar et al.

(10) Patent No.: US 8,407,544 B2
(45) Date of Patent: Mar. 26, 2013

(54) METHOD AND APPARATUS FOR AC SCAN TESTING WITH DISTRIBUTED CAPTURE AND SHIFT LOGIC

(75) Inventors: Amitava Majumdar, San Jose, CA (US); Vasu Ganti, Los Altos, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 418 days.

(21) Appl. No.: 12/761,573

(22) Filed: Apr. 16, 2010

(65) Prior Publication Data

US 2011/0258505 A1    Oct. 20, 2011

(51) Int. Cl.
*G01R 31/28* (2006.01)
(52) U.S. Cl. ........................... 714/731; 714/726
(58) Field of Classification Search .............. 714/726, 714/729, 30, 731, 699, 707, 724, 738, 812, 714/814, 815, 798, 799; 365/200, 201, 230.03; 377/64, 78, 81; 326/93
See application file for complete search history.

(56) References Cited

U.S. PATENT DOCUMENTS

| | | | | |
|---|---|---|---|---|
| 6,418,545 | B1 * | 7/2002 | Adusumilli | 714/729 |
| 7,380,189 | B2 * | 5/2008 | Konuk | 714/731 |
| 7,558,998 | B2 * | 7/2009 | Watanabe | 714/731 |
| 7,882,410 | B2 * | 2/2011 | Ayres et al. | 714/731 |

* cited by examiner

*Primary Examiner* — Phung M Chung

(74) *Attorney, Agent, or Firm* — Williams, Morgan & Amerson, P.C.

(57) ABSTRACT

An integrated circuit device includes a plurality of functional tiles. Each functional tile may be configured into a scan chain. A clock generator is operable to generate an internal clock signal that is distributed to each of the functional tiles. A clock gater is associated with each of the functional tiles. Each clock gater is operable to receive an external enable signal and the internal clock signal, generate a scan clock signal for loading a test pattern into the scan chain based on the external enable signal and the internal clock signal, and generate at least one capture clock signal for capturing a response of the tile to the test pattern responsive to identifying the loading of the test pattern.

29 Claims, 5 Drawing Sheets

METHOD AND APPARATUS FOR AC SCAN TESTING WITH DISTRIBUTED CAPTURE AND SHIFT LOGIC

CROSS-REFERENCE TO RELATED APPLICATIONS

Not applicable.

BACKGROUND

The disclosed subject matter relates generally to integrated circuit device testing and, more particularly, to a method and apparatus for AC Scan (i.e., scan-based AC or high-speed testing) with distributed capture and shift logic.

One technique for characterizing integrated circuit devices is commonly referred to as scan testing. In a scan topology, the flip flops of a logic unit are placed into a serial chain using alternate test mode routing circuitry, resulting in a circuit resembling a serial shift register with as many stages as the number of flip flops. Test patterns are shifted into the flip flops to test the logic circuitry of the device. After a test pattern is loaded into the flip flops, the response of the logic circuitry is captured in one or more of the flip flops using one or more scan clock pulses. After the results are captured, a new test pattern may be loaded into the flip flops for another test iteration while shifting out responses for the previous test pattern.

Typical devices employing scan based testing use an external clock to load the data and capture the results. This approach reduces the realism of the characterization or testing. Interactions between modules are difficult to identify and the device is not tested at its rated speed.

Some approaches deliver test patterns using by a scan clock at low speeds and test the speed paths (i.e., AC scan) of the chip using two faster clocks. The amount of time between the last scan clock and the first of the two fast clocks is normally large compared to the period of the two fast clocks, thus impacting the electrical characteristics of the circuit during test as compared with those seen during normal operation.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in an integrated circuit device including a plurality of functional tiles. Each functional tile may be configured into a scan chain. A clock generator is operable to generate an internal clock signal that is distributed to each of the functional tiles. A clock gater is associated with each of the functional tiles. Each clock gater is operable to receive an external enable signal and the internal clock signal, generate a scan clock signal for loading a test pattern into the scan chain based on the external enable signal and the internal clock signal, and generate at least one capture clock signal for capturing a response of the tile to the test pattern responsive to identifying the loading of the test pattern.

Another aspect of the disclosed subject matter is seen in a method for testing an integrated circuit device including a plurality of functional tiles. The method includes configuring storage elements in particular functional tiles into scan chains. An internal clock signal is generated in the integrated circuit device and distributed to each of the functional tiles. An external enable signal and the internal clock signal are received at each functional tile. A scan clock signal is generated for loading a test pattern into at least one of the scan chains based on the external enable signal and the internal clock signal. At least one capture clock signal is generated for capturing a response of the at least one functional tile to the test pattern responsive to identifying the loading of the test pattern.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
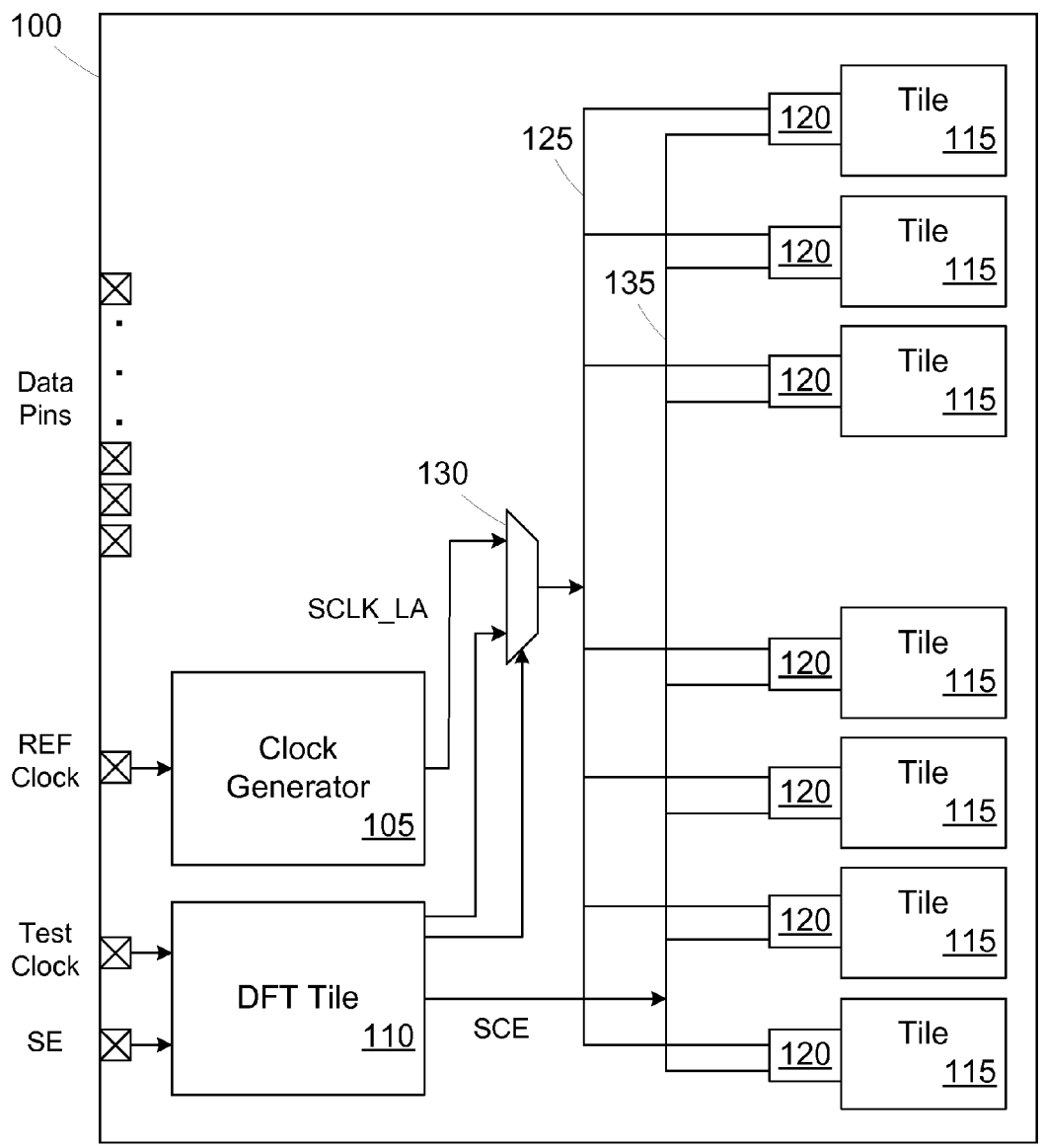
FIG. 1 is a simplified block diagram of an integrated circuit device in accordance with one embodiment of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the disclosed subject matter shall be described in the context of an integrated circuit device 100. In the illustrated embodiment, the integrated circuit device 100 is a graphics processing unit (GPU), but the techniques described herein may be applied to any integrated circuit device using a scan topology for testing or characterization. A GPU can be a discrete device or integrated into another device such as, for example, a CPU, a northbridge device, or others.

The integrated circuit device 100 includes a clock generator 105, a design for test (DFT) tile 110, and a plurality of functional tiles 115. DFT clock gaters 120 are provided for each tile 115. The clock generator 105 generally receives a reference clock signal and multiplies the reference clock to generate the operating clock signal for the integrated circuit device 100. In one embodiment, the clock generator 105 may be a phase locked loop (PLL) that keeps the internal clock signal synchronized with the reference clock, albeit at a higher frequency due to the clock multiplication. A functional tile 115 refers to a functional unit of the integrated circuit device 100. The organization of the tiles 115 may vary depending on the particular implementation of the integrated circuit device 100.

A clock distribution circuit 125 distributes a clock signal to the various tiles 115 in a controlled manner, such that the clock signals at each tile 115 are synchronized with one another. The clock distribution circuit 125 may be implemented using a tree topology, a mesh topology, or a tree-of-mesh topology, as are known in the art. In general, the clock distribution circuit 125 is designed with tightly controlled gains and delays to provide the synchronized clock signal at each tile 115. A clock multiplexer 130 may be controlled by the DFT tile 110 for selecting between an internal clock signal generated by the clock generator 105 or an external test clock signal (e.g., provided by an external tester). The DFT tile 110 also distributes a scan clock enable (SCE) logic signal using an SCE distribution circuit 135. Similar to the clock distribution circuit 125, the SCE distribution circuit 135 is a balanced tree that distributes the SCE signal such that it is synchronized at each tile 115. During a scan operation, data from one or more data pins may be routed to one or more tiles 115 for loading test patterns into the tile and/or for capturing data responsive to the test pattern.

Figure 2:
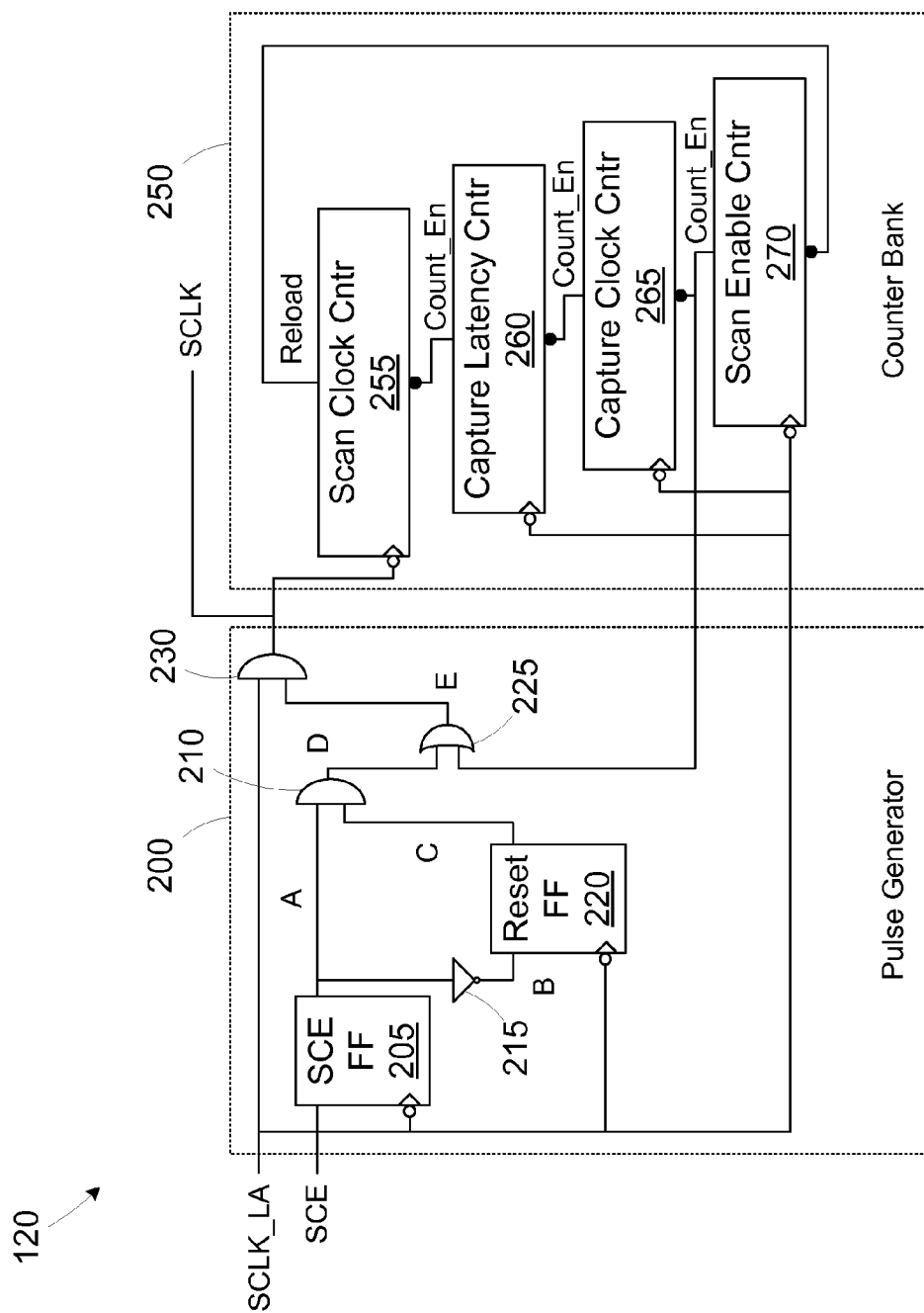
FIG. 2 is a simplified block diagram of a design for test clock gater in the device of FIG. 1.

Turning now to FIG. 2 a simplified logic diagram of a DFT clock gater 120 is provided. For purposes of this illustration, it is assumed that the clock multiplexer 130 is configured to provide the internal clock signal (SCLK_LA—scan clock, leaf level, always on) generated by the clock generator 105. The DFT clock gater 120 receives the SCLK_LA signal from the dock distribution circuit 125 and the SCE signal from the SCE distribution circuit 135. The DFT clock gater 120 includes a pulse generator 200 and a counter bank 250. In general, the pulse generator 200 passes one pulse (i.e., referred to as a scan clock pulse (SCLK)) of the SCLK_LA signal for each low-to high transition of the SCE signal. The counter bank 250 includes a plurality of counters for generating control signals for the tile 115 in response to the SCLK pulse.

The pulse generator 200 includes an SCE flip flop 205, an AND gate 210, an inverter 215, a reset flip flop 220, an OR gate 225, and a second AND gate 230. The flip flops 205, 220 are clocked by the SCLK_LA dock signal. The logic illustrated for the pulse generator 200 is exemplary, and different logic accomplishing similar signal timing may also be used.

Figure 3:
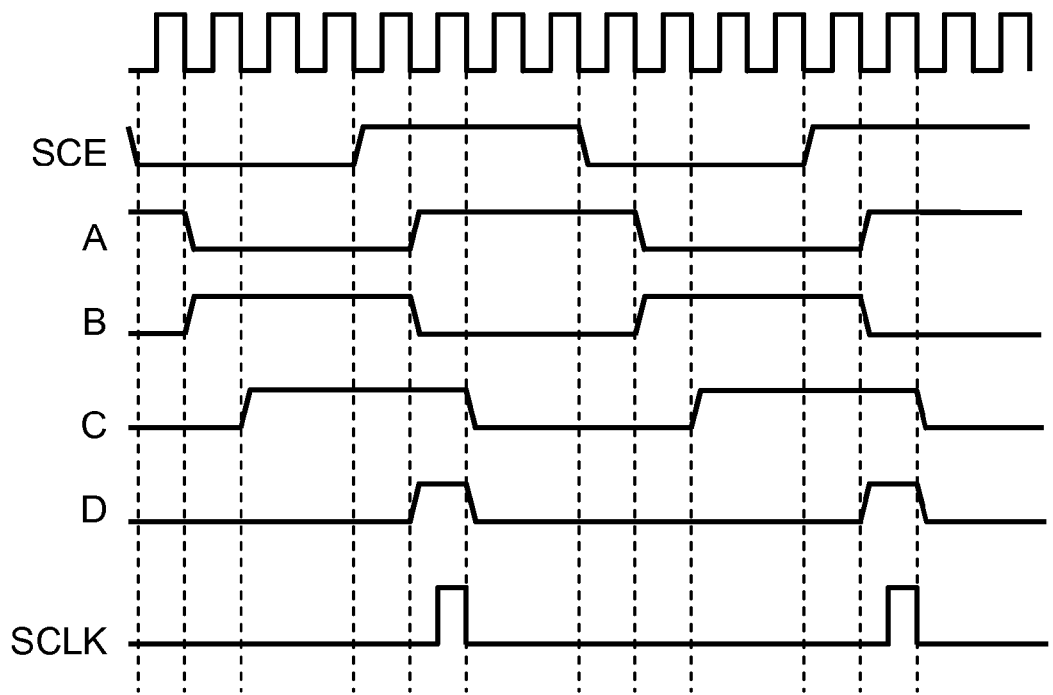
FIG. 3 is a timing diagram illustrating the operation of a pulse generator in the clock gater of FIG. 2.

The timing of the pulse generator 200 is illustrated in FIG. 3. A transition of the SCE signal is latched into the SCE flip flop 205. The output, A, of the SCE flip flop 205 transitions high on the next cycle of SCLK_LA. The inverter 215 inverts the output A, to generate the signal, B, which is provided to the reset flip flop 220. The reset flip flop 220 transitions its output, represented by C, one SCLK_LA cycle after the transition in signal A. Hence, the outputs A and C are both high during the cycle after the SCE flip flop 205 is latched high and prior to the reset flip flop 220 resetting low, which generates the output signal, D, of the AND gate 210. The signal, D, asserts the OR gate 225 (signal E), which in turn asserts the AND gate 230 on the next cycle of the SCLK_LA signal to generate the SCLK pulse. In general, the timing between SCLK_LA and the AND gate 230 and the timing along the path from SCLK_LA through flip flops 205, 220 and signals C, D, E to the AND gate 230 are managed to enable exactly one full width SCLK_LA pulse at signal SCLK.

The SCE signal is used to load the shift register formed by the flip flops in the tile 115. Once the test pattern is loaded, the counter bank 250 generates subsequent timing signals for capturing the results from the test pattern. The counter bank includes a scan clock counter 255, a capture latency counter 260, a capture clock counter 265, and a scan enable counter 270. The scan clock counter 255 is clocked by the SCLK signal, and the other counters 260, 265, 270 are clocked by the SCLK_LA signal. The elements of the counter bank 250 may be configured during a JTAG initialization of the integrated circuit device 100. In general, the timing between SCLK_LA and the AND gate 230 and timing along the path from SCLK_LA, the capture clock counter 265, the OR gate 225, signal E, and the AND gate 230 are managed to enable exactly the number of full-width clock pulses at signal SCLK, that was programmed in the capture clock counter 265.

The scan clock counter 255 is configured to count the number of SCE pulses needed to complete the test pattern (i.e., to load the flip flops with the complete test pattern). Once the number of pulses in the test pattern is reached, the scan clock counter 255 generates an output to trigger the capture latency counter 260. The capture latency counter 260 imposes a configurable latency by waiting a predetermined number of cycles of the SCLK_LA signal prior to generating its output responsive to the output asserted by the scan clock counter 255. For example, if the capture latency counter 260 is configured with a latency of 3, the capture latency counter 260 asserts its output 3 SCLK_LA cycles after the scan clock counter 255 asserts its output.

Upon receiving the output of the capture latency counter 260, the capture clock counter 265 generates a stream of capture clock pulses for capturing the response of the tile 115 to the test pattern. The number of capture pulses may vary depending on the particular nature of the tile 115. The pulses output by the capture clock counter 265 are provided to the OR gate 225, thus asserting the OR gate 225 and the AND gate 230 during SCLK_LA cycles to generate a stream of SCLK pulses corresponding to the desired number of capture clock cycles.

The scan enable counter 270 is configured to count the number of capture pulses from the capture clock counter 265 and assert its output when the capture stream is complete. The output of the scan enable counter 270 resets the scan clock counter 255 to allow a new test pattern to be loaded into the tile 115.

Hence, the tester controlling the testing of the integrated circuit device 100 provides the test pattern and loads the test pattern using transitions of the SCE signal, which cause the pulse generator 200 to generate SCLK pulses. The counter bank 250 recognizes that the test pattern has been loaded and automatically generates capture pulses to allow the test pattern to propagate through the tile and allow the results to be recorded by the tester. The counter bank 250 automatically resets and waits for the next test pattern. By automatically generating the capture pulses, the tile 115 can be tested at its rated speed, as the capture pulses are generated using the internal clock.

Because each tile 115 has an associated DFT clock gater 120, and the scan enable and SCLK_LA signals are distributed to each tile 115, multiple tiles can be operated at the same. This allows inter-tile pathways to be tested under full speed conditions. Selected tiles can be disabled by disabling one or more of the counters in the counter bank 250 during the test configuration initialization. The number of tiles 115 that can be simultaneously tested may be limited by the number of data pins in the integrated circuit device 100. Various tiles 115 may be grouped into subsets, and the plurality of tiles 115 in each subset may be operated in parallel.

Typically, the integrated circuit device 100 is powered by connecting voltage and ground sources to pins on the package. Within the package, these pins are connected via interconnect structures to power pads, commonly called power bumps, on the die. For a particular tile 115, one or more power bumps may be associated with providing voltage or ground to the flip flops. Due to the large number of flip flops potentially active at the same time, the power grid may be stressed resulting in test failures due to the power grid as opposed to the functioning of the integrated circuit device 100. To avoid overloading the power grid, the flip flops in a particular tile 115 may be grouped into subsets and loaded at different cycles.

Figure 4:
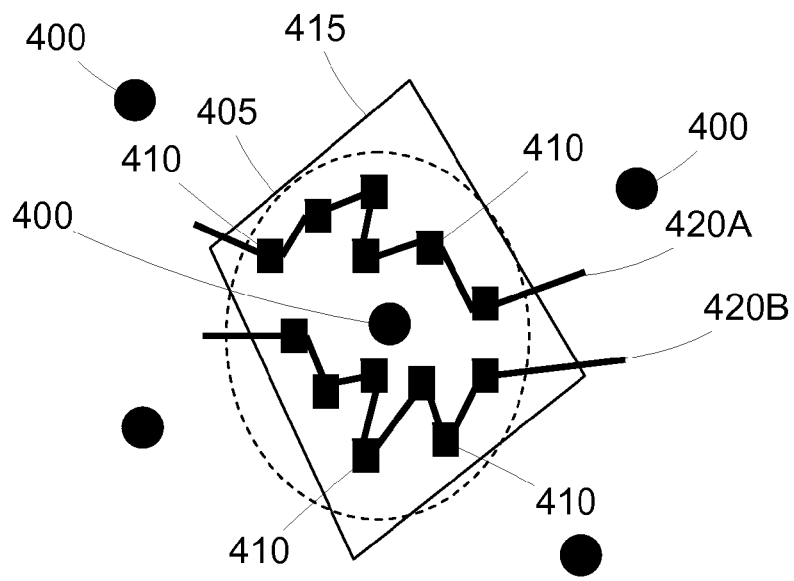
FIG. 4 is a diagram illustrating a power bump neighborhood.

As shown in FIG. 4, multiple power bumps 400 are provided to power a tile 115 (e.g., voltage and ground). For each power bump 400, a power bump neighborhood 405 may be defined that includes a set of flip flops 410. In a conventional scan chain technique, the flip flops in the tile 115 would be stitched to minimize the route for the chain, resulting in a scan chain, $S_c$, of flip flops. Such a conventional scan chain would have the potential to traverse multiple power bump neighborhoods 405.

In one embodiment, a Voronoi tessellation technique may be used to define the power bump neighborhoods 405, $N_b$. A two-dimensional space may be defined with the power bumps 400 designated as nodes within the space, as represented by a Voronoi tessellation subset 415. The tessellation may be projected onto a layer with cell boundaries, where a flip flop cell having a corner (e.g., lower left corner) in $N_b$ is a member of a domain, $D_b$, of bump b. The power bump neighborhoods 405 define partitions of the flip flops in the preliminary chain. A premise behind this grouping is that for a flip flop $f \in D_b$, logic driven by f draws most of its current from power bump b. Of course, other partitioning methods may be used depending on the particular implementation and particular power delivery considerations.

Within each power bump neighborhood 405, the flip flops 410 in $S_c$ are partitioned into K subsets, each designated as $S_c(b,i)$ ($0 \leq i \leq K-1$). For each power bump b, the flip flops 410 in $S_c(b,i)$ are stitched into a single scan chain resulting in a chain $S_c(i)$ (i.e., as opposed to the conventional $S_c$ chain). In one embodiment, a chain in power-bump neighborhood, $N_b$, may be stitched together with a chain in a neighborhood, $N_d$, of a different power bump d to create a longer scan chain traversing multiple bump neighborhoods. As described in greater detail below, the scan clock (SCLK) signals for each chain $S_c(b,i)$ may be staggered to avoid overloading the power bump b. In the example of FIG. 4, two scan chains 420A, 420B are defined for the power bump neighborhood 405.

Figure 5:
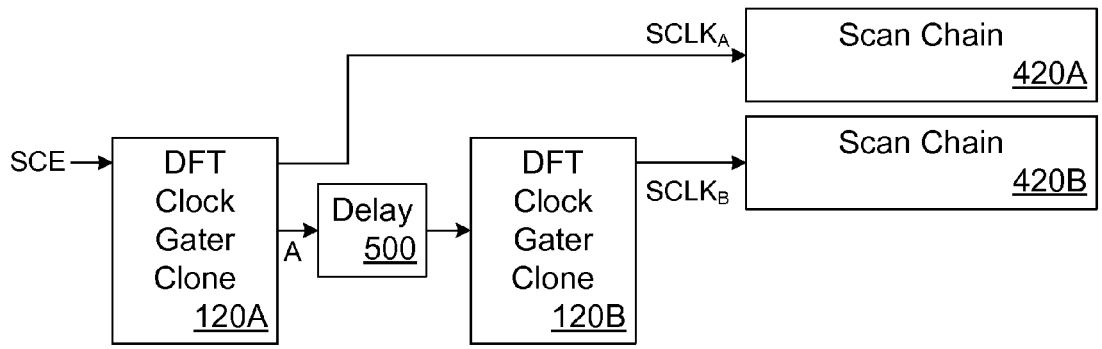
FIG. 5 is a simplified block diagram illustrating clock gater clones for controlling multiple scan chains associated with the power bump neighborhood of FIG. 4.
Figure 6:
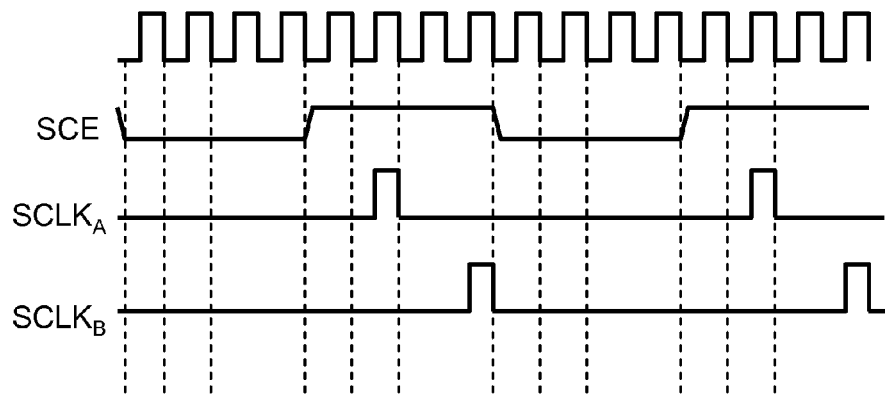
FIG. 6 is a timing diagram illustrating the operation of the clock gater clones of FIG. 5.

FIG. 5 illustrates a simplified block diagram illustrating one embodiment of cascaded DFT clock gater clones 120A, 120B that are employed to operate the scan chains 420A, 420B of FIG. 4. FIG. 6 is a timing diagram illustrating how the SCLK signals of the scan chains 420A, 420B are cascaded. The DFT clock gater clones 120A, 120B each have the circuitry illustrated for the DFT clock gater 120 shown in FIG. 2. The SCE flip flop 205 of the first DFT clock gater clone 120A receives the SCE signal as its input. However, the SCE flip flop 205 of the second DFT clock gater clone 120B receives its input from the output of the SCE flip flop 205 of the first DFT clock gater clone 120A (i.e., the signal A in FIG. 2). Hence, there is a delay introduced between the activations of the first and second DFT clock gater clones 120A, 120B.

In other embodiments, the secondary DFT clock gater clones 120B may have a simpler design. For example, a shift register may be employed to receive the output SCLK from the DFT clock gater clone 120A and shift the signal to the next scan chain 420B. In a different embodiment, signal D of gate 210 in FIG. 2 may be propagated through delays without replicating (or cloning) the DFT clock gater 120 of FIG. 2.

The delay may be increased by providing one or more optional delay elements 500 (e.g., flip flops clocked by SCLK_LA) between the DFT clock gater clone 120A and the DFT clock gater clone 120B. In the example shown in FIG. 6, one delay element 500 is provided between the DFT clock gater clones 120A, 120B resulting in a two-cycle delay between the SCLK signals for each scan chain 420A, 420B. In other embodiments, the delay element 500 may be combinational, and the delay may not be expressed in an integer number of clock cycles. The number of delay elements 500 may be varied to tailor the amount of delay imposed. The number of DFT clock gater clones 120A, 120B may also be varied depending on the number of scan chains 420A, 420B for the power bump 400. By delaying the SCLK signal over the scan chains 420A, 420B the number of flip flops 410 and associated logic transitioning due to the transitioning of the flip-flops 410 in a bump neighborhood at the same time is reduced. Within each DFT clock gater clone 120A, 120B, the value of the capture latency counter 260 (see FIG. 2) may be set at a sufficient number of clock cycles to allow each scan chain 420A, 420B to be loaded. The minimum value for the capture latency counter 260 would be based on the number of DFT clock gater clones 120A, 120B plus the number of delay elements 500 between each clone.

Staggering the loading of the scan chains 420A, 420B within a power bump neighborhood 405 reduces the transient power draw from the power bump 400. This reduction reduces the likelihood that a power grid failure will cause a test failure of the integrated circuit device 100.

Figure 7:
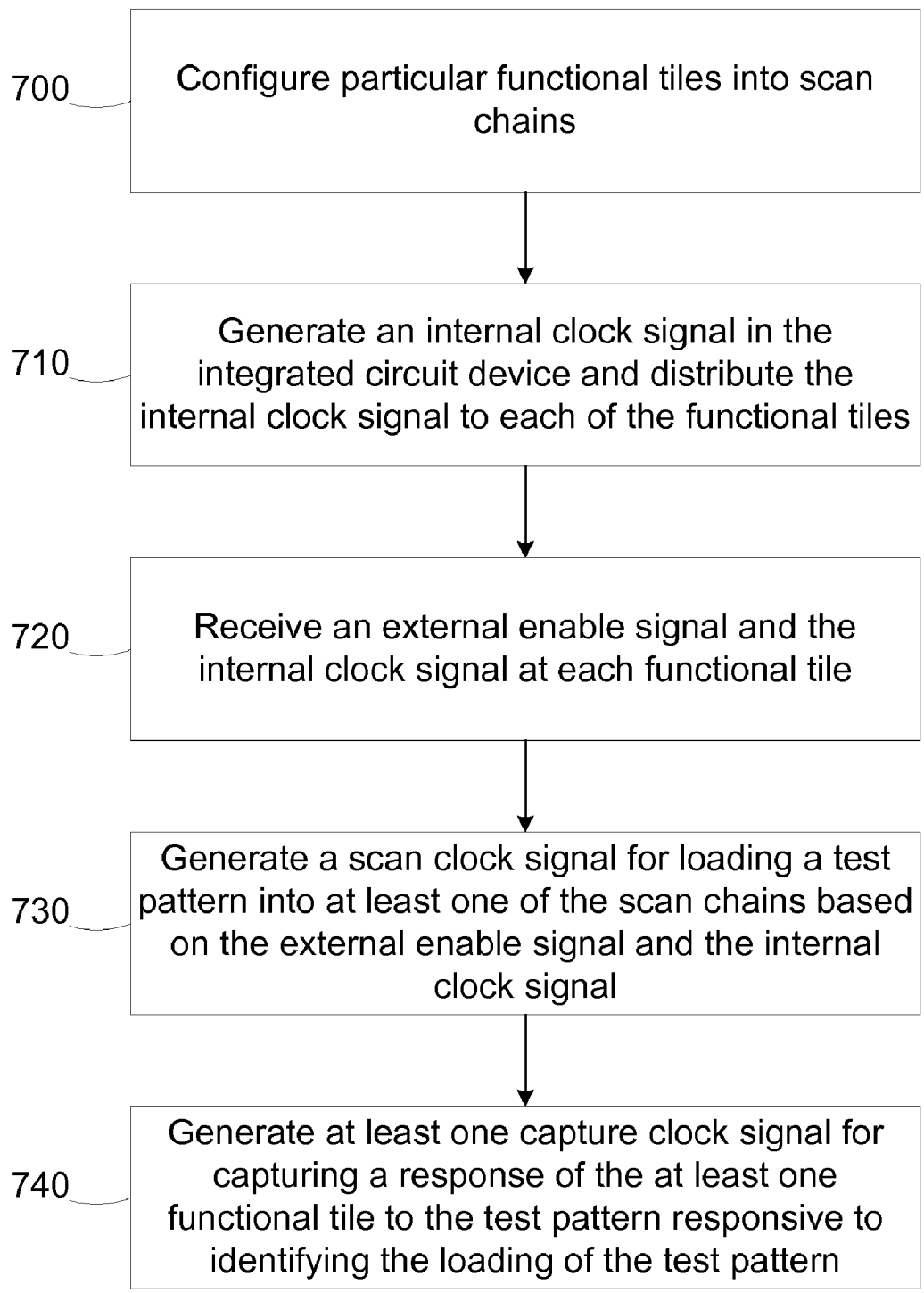
FIG. 7 is a simplified flow diagram of a method for testing an integrated circuit device including a plurality of functional tiles.

Turning now to FIG. 7, a simplified flow diagram of a method for testing an integrated circuit device including a plurality of functional tiles is provided. In method block 700 particular functional tiles are configured into scan chains. In method block 710, an internal clock signal is generated in the integrated circuit device and the internal clock signal is distributed to each of the functional tiles. In method block 720, an external enable signal and the internal clock signal are received at each functional tile. In method block 730, a scan clock signal is generated for loading a test pattern into at least one of the scan chains based on the external enable signal and the internal clock signal. In method block 740, at least one capture clock signal for capturing a response of the at least one functional tile to the test pattern is generated responsive to identifying the loading of the test pattern.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. An integrated circuit device, comprising:
   a plurality of functional tiles, wherein each functional tile is configurable into a scan chain;
   a clock generator configured to generate an internal clock signal that is distributed to each of the functional tiles; and
   a plurality of clock gaters, each clock gater being associated with one of the functional tiles, wherein each clock gater is configured to receive an external enable signal and the internal clock signal, generate a scan clock signal for loading an external test pattern into the scan chain based on the external enable signal and the internal clock signal, and generate at least one capture clock signal for capturing a response of the associated functional tile to the external test pattern responsive to identifying the loading of the external test pattern.

2. The device of claim 1, wherein each clock gater comprises a pulse generator configured to generate one pulse of the scan clock signal using the internal clock signal responsive to an assertion of the external enable signal.

3. The device of claim 1, wherein each clock gater comprises a counter bank configured to identify the loading of the external test pattern and generate the capture clock signal.

4. The device of claim 3, wherein the counter bank comprises a scan clock counter configured to count pulses in the scan clock signal and generate a load signal identifying the loading of the external test pattern responsive to the counted pulses equaling a test pattern length of the external test pattern.

5. The device of claim 4, wherein the counter bank comprises a capture clock counter configured to generate at least one capture signal responsive to the load signal, and each clock gater is configured to generate the capture clock signal responsive to the capture signal.

6. The device of claim 5, wherein each clock gater comprises a pulse generator configured to generate one pulse of the scan clock signal as the capture clock signal responsive to the capture signal.

7. The device of claim 6, wherein each clock gater comprises a pulse generator configured to perform a logical AND operation with the internal clock signal and the at least one capture signal to generate the capture clock signal.

8. The device of claim 5, wherein the counter bank comprises a latency counter coupled between the scan clock counter and the capture clock counter and configured to delay the load signal by a predetermined number of cycles of the internal clock signal.

9. The device of claim 5, wherein the counter bank comprises a scan enable counter coupled to the capture clock counter and the scan clock counter and configured to reset the scan clock counter responsive to the capture clock counter generating the at least one capture signal.

10. The device of claim 1, further comprising a distribution circuit configured to distribute the external enable signal to each of the clock gaters in a synchronized manner.

11. The device of claim 1, wherein the scan chain for a particular functional tile is divided into a plurality of sub-chains, and at least one of the clock gaters further comprises:
    a first clock gater configured to generate a first scan clock signal for a first one of the sub-chains; and
    a second clock gater configured to receive an input signal from the first clock gater and generate a second scan clock signal for a second one of the sub-chains, wherein the second scan clock signal is delayed with respect to the first scan clock signal.

12. The device of claim 11, wherein the delay between the first and second scan clock signals is less than an interval between adjacent assertions of the external enable signal.

13. The device of claim 11, wherein the second clock gater comprises a delay element.

14. The device of claim 11, wherein the first clock gater comprises a first flip flop coupled to receive the external enable signal at an input terminal, and the input signal provided to the second clock gater comprises an output terminal of the first flip flop.

15. The device of claim 14, further comprising at least one delay element coupled between the output terminal of the first flip flop and the second clock gater.

16. The device of claim 11, wherein the input signal provided to the second clock gater comprises the first scan clock signal.

17. The device of claim 11, further comprising a third clock gater configured to receive an input signal from the second clock gater and generate a third scan clock signal for a third one of the sub-chains, wherein the third scan clock signal is delayed with respect to the second scan clock signal.

18. The device of claim 11, further comprising a plurality of power bumps for providing power to the functional tiles, wherein power bump neighborhoods are defined for at least some of the power bumps, and each of the sub-chains is associated with at least one power bump neighborhood.

19. The device of claim 1, wherein the integrated circuit device comprises a graphics processing unit.

20. A method for testing an integrated circuit device including a plurality of functional tiles, comprising:
 configuring particular functional tiles into scan chains;
 generating an internal clock signal in the integrated circuit device and distributing the internal clock signal to each of the functional tiles;
 receiving an external enable signal and the internal clock signal at each functional tile;
 generating a scan clock signal for loading an external test pattern into at least one of the scan chains based on the external enable signal and the internal clock signal; and
 generating at least one capture clock signal for capturing a response of the at least one functional tile to the external test pattern responsive to identifying the loading of the external test pattern.

21. The method of claim 20, further comprising generating one pulse of the scan clock signal using the internal clock signal responsive to an assertion of the external enable signal.

22. The method of claim 20, further comprising counting pulses of the scan clock signal to identify the loading of the external test pattern.

23. The method of claim 20, further comprising generating one pulse of the scan clock signal as the capture clock signal.

24. The method of claim 20, further comprising:
 dividing the scan chain for a particular functional tile into a plurality of sub-chains;
 generating a first scan clock signal for a first one of the sub-chains; and
 generating a second scan clock signal for a second one of the sub-chains, wherein the second scan clock signal is delayed with respect to the first scan clock signal.

25. The method of claim 24, wherein the delay between the first and second scan clock signals is less than an interval between adjacent assertions of the external enable signal.

26. The method of claim 25, wherein generating the second scan signal comprises generating the second scan signal responsive to an assertion of the first scan clock signal.

27. The method of claim 24, wherein generating the second scan signal comprises delaying the external enable signal, and generating the second scan clock signal based on the delayed external enable signal.

28. The method of claim 24, wherein the integrated circuit device comprises a plurality of power bumps for providing power to the functional tiles, and the method further comprises:
 defining power bump neighborhoods for at least some of the power bumps; and
 dividing the scan chain into the plurality of sub-chains to associate each of the sub-chains with at least one power bump neighborhood.

29. An integrated circuit device including a plurality of functional tiles configurable as scan chains, comprising:
 means for generating an internal clock signal in the integrated circuit device and distributing the internal clock signal to each of the functional tiles;
 means for receiving an external enable signal and the internal clock signal at each functional tile;
 means for generating a scan clock signal for loading an external test pattern into at least one of the scan chains based on the external enable signal and the internal clock signal; and
 means for generating at least one capture clock signal for capturing a response of the at least one functional tile to the external test pattern responsive to identifying the loading of the external test pattern.

* * * * *